(12) United States Patent  
Picard et al.

(10) Patent No.: US 8,325,039 B2  
(45) Date of Patent: Dec. 4, 2012

(54) LOCKING DEVICE WITH EMBEDDED CIRCUIT BOARD

(75) Inventors: Daniel J. Picard, Watertown, CT (US); Robert C. Hunt, Reno, NV (US); Scott B. Lowder, Orange, CT (US)

(73) Assignee: Sargent Manufacturing Company, New Haven, CT (US)

( * ) Notice: Subject to any disclaimer, the term of this patent is extended or adjusted under 35 U.S.C. 154(b) by 322 days.

(21) Appl. No.: 12/712,643

(22) Filed: Feb. 25, 2010

(65) Prior Publication Data

US 2011/0203331 A1 Aug. 25, 2011

(51) Int. Cl.  
*E05B 45/06* (2006.01)

(52) U.S. Cl. ........................................ 340/542; 361/752

(58) Field of Classification Search .................. None  
See application file for complete search history.

(56) References Cited

U.S. PATENT DOCUMENTS

| | | | |
|---|---|---|---|
| 4,616,491 A | 10/1986 | Genest | |
| 4,633,687 A | 1/1987 | Fane | |
| 5,477,041 A * | 12/1995 | Miron et al. | 340/5.28 |
| 5,539,378 A * | 7/1996 | Chang | 340/542 |
| 5,685,182 A * | 11/1997 | Chhatwal | 70/224 |
| 5,868,012 A * | 2/1999 | Chun-Te et al. | 70/30 |
| 5,986,564 A * | 11/1999 | Fraser | 340/5.6 |
| 6,120,071 A * | 9/2000 | Picard et al. | 292/165 |
| 6,145,353 A * | 11/2000 | Doucet | 70/277 |
| 6,174,004 B1 * | 1/2001 | Picard et al. | 292/165 |
| 6,374,653 B1 * | 4/2002 | Gokcebay et al. | 70/278.3 |
| 6,688,063 B1 * | 2/2004 | Lee et al. | 52/455 |
| 6,720,861 B1 * | 4/2004 | Rodenbeck et al. | 340/5.64 |
| 6,876,293 B2 * | 4/2005 | Frolov et al. | 340/5.7 |
| 7,188,870 B2 * | 3/2007 | Huang | 292/163 |
| 7,273,203 B2 * | 9/2007 | Carnevali | 248/553 |
| 7,690,230 B2 * | 4/2010 | Gray | 70/277 |
| 2002/0056300 A1 * | 5/2002 | Pierre et al. | 70/303 A |
| 2004/0035160 A1 * | 2/2004 | Meekma et al. | 70/278.3 |
| 2005/0128050 A1 * | 6/2005 | Frolov et al. | 340/5.7 |
| 2005/0132766 A1 * | 6/2005 | Milo | 70/279.1 |
| 2005/0179267 A1 * | 8/2005 | Cote et al. | 292/336.3 |
| 2005/0212301 A1 * | 9/2005 | Huang | 292/169.14 |
| 2006/0114099 A1 * | 6/2006 | Deng et al. | 340/5.53 |
| 2008/0076014 A1 | 3/2008 | Gray | |
| 2008/0127686 A1 * | 6/2008 | Hwang | 70/107 |
| 2008/0209228 A1 * | 8/2008 | Chandler | 713/186 |
| 2008/0297367 A1 * | 12/2008 | Chen | 340/687 |
| 2009/0193859 A1 * | 8/2009 | Kwon et al. | 70/91 |
| 2009/0273440 A1 * | 11/2009 | Marschalek et al. | 340/5.61 |
| 2010/0031713 A1 * | 2/2010 | Brown et al. | 70/91 |
| 2010/0063524 A1 * | 3/2010 | McCombs | 606/167 |
| 2010/0192647 A1 * | 8/2010 | Gray | 70/277 |

* cited by examiner

*Primary Examiner* — Lisa Lea Edmonds  
*Assistant Examiner* — Xanthia C Cunningham  
(74) *Attorney, Agent, or Firm* — DeLio & Peterson, LLC

(57) ABSTRACT

Electrified access-control technology devices for a door, particularly electrified locks for a door, having embedded circuitry therein, and methods of making the same. One or more printed circuit boards (PCBs) having various electronic circuitry are secured inside a housing that encases an access-control device, particularly a lock, for a door. The one or more PCB(s) may be embedded on an internal surface of the housing such that the embedded PCB resides inside the housing along with the lock itself. The embedded PCB(s) avoid interference of both any working components of the lock inside the housing and any openings residing in the housing.

30 Claims, 6 Drawing Sheets

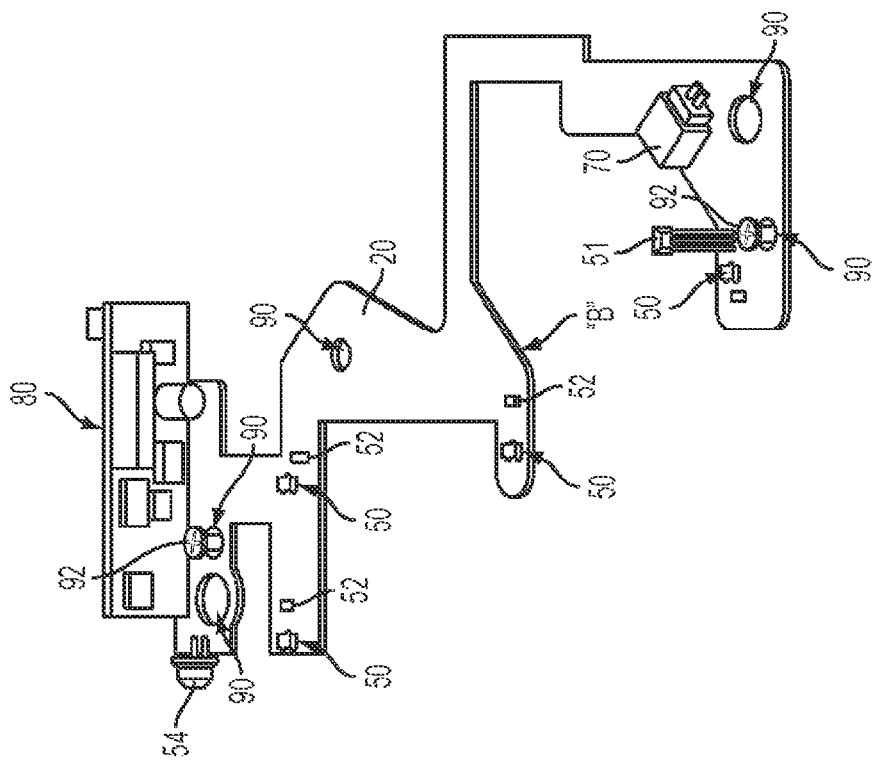
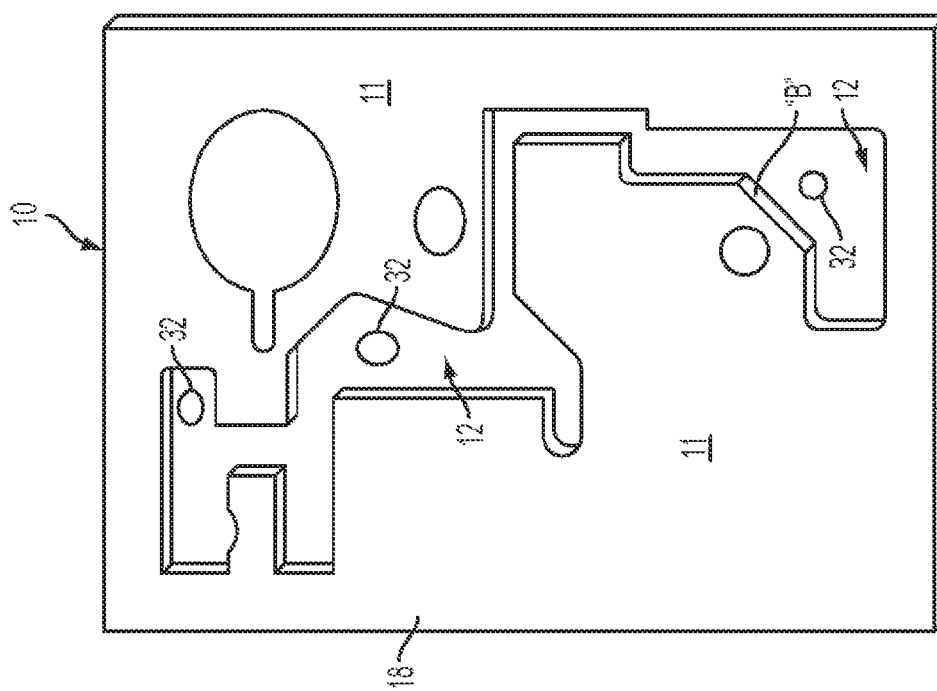

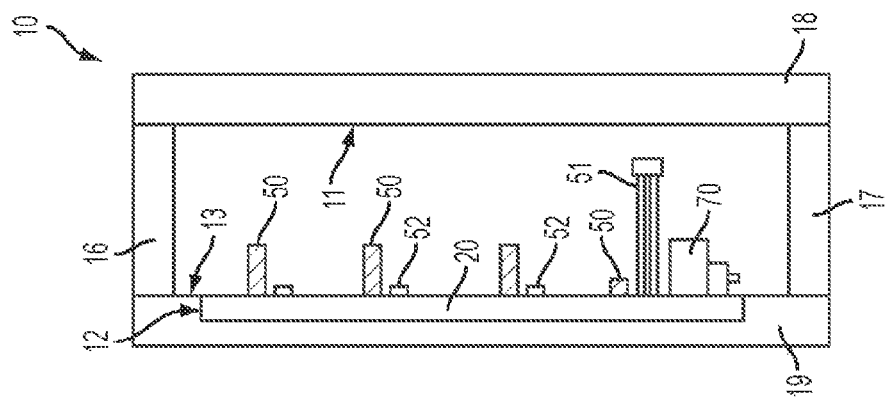
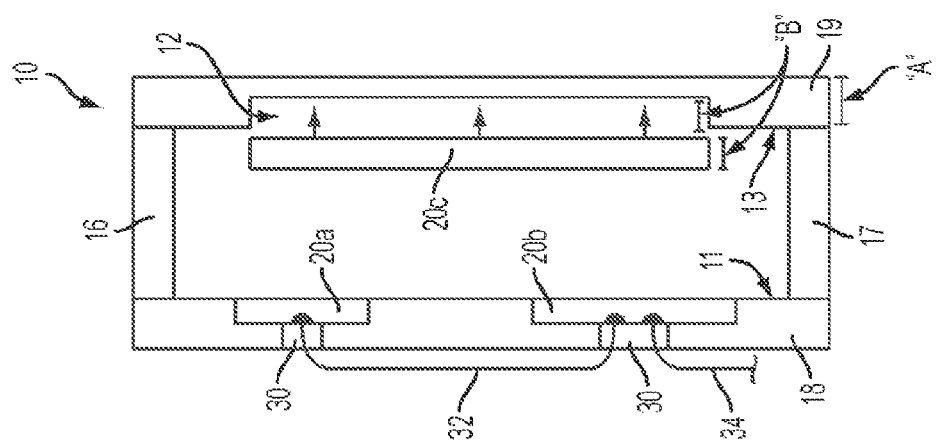

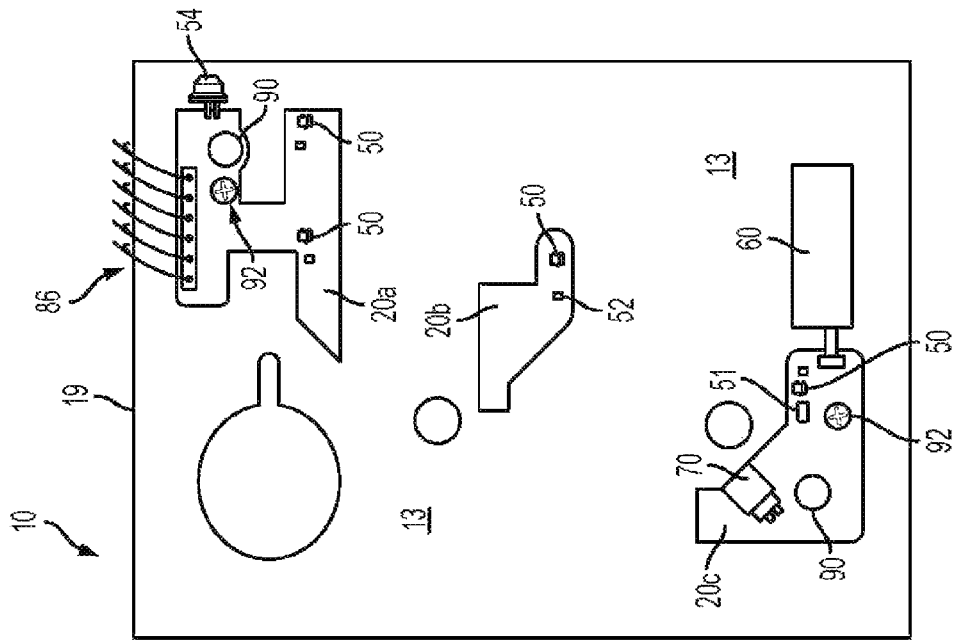
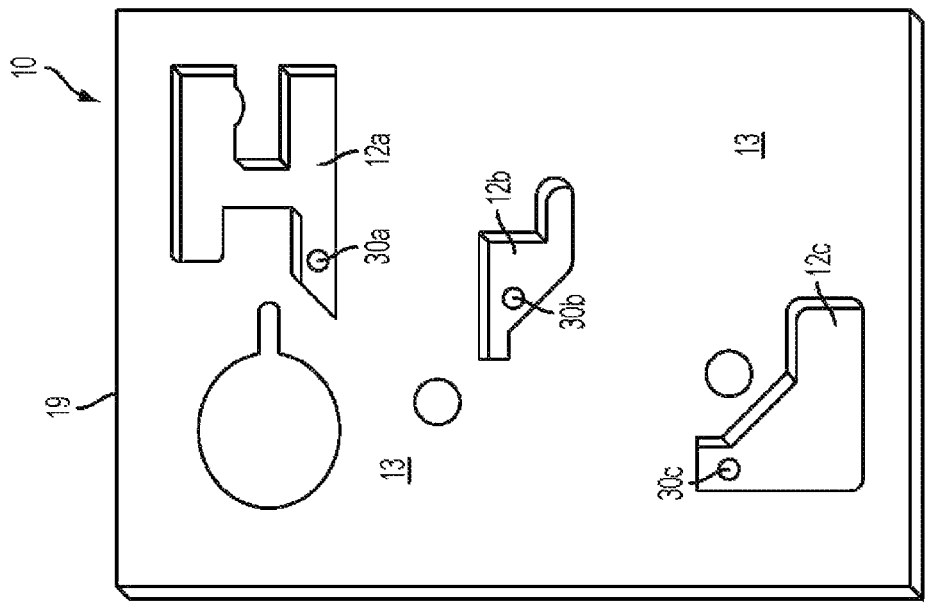

LOCKING DEVICE WITH EMBEDDED CIRCUIT BOARD

BACKGROUND OF THE INVENTION

1. Field of the Invention

This invention relates generally to embedded circuitry, and more particularly, to circuit boards embedded inside an access-control technology device of a door to provide electrification thereto.

2. Description of Related Art

There are currently various types of access-control technology devices available for use with, on or inside a door. For instance, it is known to use access-control technology in locking devices. In recent years, access-control technology in locking devices has increasingly shifted from traditional keying systems and mechanical articulation to digital monitoring and electronic actuation. Various electronically actuated locks and exit devices for doors exist in the art. These electronically actuated locks are generally classified into two categories, namely, those having electronic circuitry housed inside a mortised recess of a door, and those having electronic circuitry housed in an escutcheon-type lock assembly.

In mortised recess assemblies, electronic circuitry is housed in a mortised recess of a door whereby this mortised recess is separate from a mortise housing the locking device of the door. In escutcheon-type assemblies, the electronic circuitry is housed in a casing that resides on the exterior of the door, and as such, is also separate from the lock device itself.

In both of these types of assemblies, since the electronic circuitry is external to the lock itself, intricate wiring is required to provide the necessary electrical connection between the external circuitry and the lock device. This entails routing wiring from the external electronic circuitry, into the lock, and discretely throughout the lock in a pattern that avoids the mechanical working components of the lock. The routed wiring inside the lock is connected to switches and actuators residing therein for providing an electronically actuated and monitored lock.

Whether the electronic circuitry resides in a mortised recess or an escutcheon, it has been found that there are many disadvantages to these conventional electronically actuated lock assemblies.

With the constrained real estate in a majority of currently available locks, it has become difficult and burdensome to provide the necessary wiring into and throughout the lock for the electrical connection between the switches and actuators in the lock and the electronic circuitry external to the lock. Concerns are also raised when too much electrical wiring resides external to the locking device. Insulated wire harnesses routed through a lockbody are subject to damage from contact with mechanical components.

It is also undesirably burdensome, time consuming, expensive and expends valuable real estate within the lock by requiring the lock casing to be fabricated with a number of holes and slots for accommodating the inserted wiring, as well as to be fabricated with brackets or harnesses inside the lock for securing and positioning the wiring accommodated therein. As such, these conventional mortised recess and escutcheon-type lock assemblies suffer from fabrication difficulties as well as performance limitations in providing accurate wire routing to switches, actuators, and wire harnesses within existing mechanical lock mechanisms having constrained real estate.

Additional drawbacks of housing electronics in an escutcheon is that these types of assemblies reside on and project outward from the exterior of the door, often precluding the addition of auxiliary hardware on such door. Escutcheon-type assemblies are also less vandal resistant by virtue of its visibility and accessibility on the surface of the door. Further drawbacks of the mortised recessed housed electronics include the increased difficulty for door manufacturers and installers to provide the precise sizing and shape of the mortised recess that fits the housing in which the electronics reside.

Accordingly, a need exists in the art for improved methods and apparatus for access-control technology devices available for use with, on or inside a door. One of these needs is for improved methods and apparatus for access-control technology in locking devices that allows digital monitoring and electronic actuation to be implemented in current locking devices that have constrained real estate. This constrained real estate may be due to more compact designs, or even those existing mechanical lock mechanisms having increased and/or improved technological advances residing inside the lock that consume an increased and/or substantial portion of the valuable real estate therein.

SUMMARY OF THE INVENTION

Bearing in mind the problems and deficiencies of the prior art, it is therefore an object of the present invention to provide methods and apparatus for fabricating access-control technology as electrified access-control technology having embedded circuitry therein.

It is another object of the present invention to provide methods and apparatus for converting currently existing mechanically operated access-control technology into digitally monitored and electrically controlled and actuated access-control technology.

Another object of the present invention is to provide methods and apparatus for converting an existing mechanical access-control technology device for a door into an electrified access-control technology device for a door that has capabilities for digital monitoring and electronic control and actuation.

It is yet another object of the present invention to provide methods and apparatus for converting an existing mechanical lock into an electrified lock having capabilities for digital monitoring and electronic actuation.

A further object of the invention is to provide methods and apparatus for easily and efficiently electrifying existing access-control technology (e.g., an existing mechanical lock) having constrained real estate.

Still another object of the invention is to provide methods and apparatus for easily and efficiently providing existing access-control technology (e.g., an existing mechanical lock) with increased performance capabilities by securing a printed circuit board within the mechanical lock housing.

It is another object of the present invention to provide a unified design that allows for alternate circuit boards to be developed, which accomplishes different functions (i.e. modularity and future-proofing).

Another object of the present invention is to provide methods and apparatus for electrifying existing access-control technology (e.g., an existing mechanical lock) easily, efficiently and cost effectively.

Still other objects and advantages of the invention will in part be obvious and will in part be apparent from the specification.

The above and other objects, which will be apparent to those skilled in the art, are achieved in the present invention which is directed to an electrified access-control device that includes a housing having at least one side with an internal surface facing an inside of the housing and an access-control device residing in the inside of the housing. A channel resides in the internal surface of the at least one side inside the housing, and a printed circuit board (PCB) resides within the channel inside the housing. The PCB has various electrical components attached thereto for electrifying the access-control device.

In one or more embodiments, the access-control device may be a lock that is electrified by the PCB, whereby the electrified lock is provided with both digital monitoring and electronic actuation capabilities. Such locks may include, but are not limited to, a mortise lock, a bored lock, a cylindrical lock, a tubular lock, an auxiliary lock, and a deadbolt. In alternative embodiments, the access-control device may be an exit device, an electronic door strike, a door closer, or a door operator. In one or more embodiments the channel is embedded within the internal surface of the housing side, whereby the PCB has a configuration matching the embedded channel's configuration so that the PCB is matingly embedded within the recessed channel. The exposed surface of the embedded PCB may be planar with a surface of the at least one side, whereby the embedded PCB covers over a distance of more than 50% of a diagonal distance across a surface area of the internal surface of the housing side.

Also in one or more embodiments, a plurality of channels may reside on the internal surface of the at least one side inside the housing, along with a plurality of PCBs corresponding to configurations of each of the plurality of channels. The plurality of PCBs may be embedded within respective ones of the plurality of channels inside the housing. Various electrical components may be attached to the plurality of embedded PCBs for electrifying the access-control device. In one or more embodiments, the various electrical components attached to the embedded PCBs may include, but are not limited to, one or more sensors, actuators, surface mount connectors, signal output devices, accelerometers, temperature sensors, heating components, and combinations thereof.

In other aspects, the invention is directed to an electrified access-control device for a door that includes a housing having a first side and a second side, whereby each of the first and second sides have corresponding internal surfaces facing an inside of the housing, with an access-control device being a lock residing inside the housing. At least one recessed channel resides in the internal surface of either the first or second side of the housing, while at least one PCB is embedded within the recessed channel in the internal surface of either the first or second side of the housing. A variety of electrical components are attached to the PCB to electrify the lock.

In the one or more embodiments of the invention, the variety of electrical components may provide the electrified lock with digital monitoring and/or electronic actuation capabilities, while the electrified lock may include, but is not limited to, a mortise lock, a bored lock, a cylindrical lock, a tubular lock, an auxiliary lock, or a deadbolt. The at least one embedded PCB may be a single PCB having a sinusoidal shape that covers over a distance of more than 50% of a diagonal distance across a surface area of the internal surface of the housing side in which the PCB is embedded. In one or more embodiments an exposed surface of the at least one recessed channel may have one or more openings therein to access a backside of the at least one PCB. The at least one recessed channel and the at least one embedded PCB may have matching configurations, whereby these matching configurations avoid interference with working components of the lock and/or openings in the housing. An exposed surface of the embedded PCB may be planar with an exposed surface of the internal surface of the housing side in which the PCB is embedded.

In further embodiments of the invention, the variety of electrical components include one or more sensors residing on the PCB and positioned at various locations across the PCB, the various locations corresponding to locations where one or more magnets reside on mechanical working components of the lock, whereby the one or more sensors sense the one or more magnets to detect positions of the mechanical working components of the lock. These sensors may include, but are not limited to, non-contact sensors, analogue transducers, hall sensors, electrical switches, reed switches, reed sensors, and combinations thereof. One or more of these sensors may be raised away from an exposed surface of the PCB to sense the one or more magnets residing adjacent an opposing side of the housing. The variety of electrical components may also include one or more sensors that do not require a magnet for triggering.

In still further embodiments, the variety of electrical components may include an actuator residing inside the housing and in electrical communication with the PCB. This actuator may be, but is not limited to, a solenoid, motor, brush DC motor, stepper motor, piezo motor, and shape memory actuator. The variety of electrical components may also include one or more surface mount connectors attached to the PCB. In one or more embodiments the electrical components may include one or more electrical components surface mounted to a surface of the PCB including, but not limited to, an accelerometer, temperature sensors, heating components, and combinations thereof. The electrical components may also include one or more signal output device connected to the PCB, whereby the signal output device converts various electrical output signals from the PCB into one or more digital output signals. For instance, the signal output device may be a controller board or a wire harness.

Also in one or more embodiments, the electrified access-control device may include a plurality of channels recessed within one or more of the first or second sides of the housing, along with a plurality of PCBs corresponding to configurations of the plurality of recessed channels, whereby each of the plurality of PCBs is embedded within respective ones of the plurality of recessed channels. The various electrical components attached to the plurality of embedded PCBs electrify the lock. These plurality of embedded PCBs may reside on the first side alone, the second side alone, or both the first and second sides of the housing, whereby the plurality of embedded PCBs are in electrical communication with one another to electrify the lock.

In still other aspects, one or more embodiments of the invention are directed to methods of fabricating an electrified lock by providing a housing having a first side having an internal surface facing an inside of the housing and providing a mechanical lock inside the housing. A second side of the housing is fabricated to have at least one recessed channel residing in a surface thereof, and at least one PCB having a variety of electrical components attached thereto is embedded within the recessed channel in the surface of the second side. The mechanical lock is converted into an electrified lock by attaching the second side to the housing so that the surface of the second side having the embedded PCB faces the inside of the housing.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1A is a top elevational view of a locking device housing side having a recessed opening therein for receiving a printed circuit board (PCB) in accordance with one or more embodiments of the invention.

FIG. 1B is a top elevational view of a PCB of the invention having a configuration that is selected to avoid interference with any mechanical working components within a mechanical locking device. A variety of electrical components are surface mounted to the PCB so that the backside of the PCB remains substantially planar.

FIG. 1E is a side view showing one or more PCBs of the invention embedded within one or more lateral sidewalls of a locking device housing, with the embedded PCBs being in electrical communication with one another. As shown, each PCB has a thickness equivalent to a depth of its corresponding recessed opening so that after embedding the PCB into the recess, the surface of the PCB is planar with the remaining internal surface of the side in which the PCB resides to avoid interference with the mechanical working components of the lock.

FIG. 1F is another side view showing a single PCB module in accordance with one or more embodiments of the invention embedded into lateral side of a locking device housing, whereby the PCB may have electronic components adjacent the surface of the PCB and/or electronic components that extend into the locking device to detect motion and multiple positions of the working components of such lock.

FIGS. 2A-B are a side elevational view and a top plane view, respectively, showing that multiple PCBs having surface mount technology may be embedded within one or more sidewalls inside a locking device housing in accordance with one or more embodiments of the invention.

DESCRIPTION OF THE PREFERRED EMBODIMENT(S)

Figure 1C:
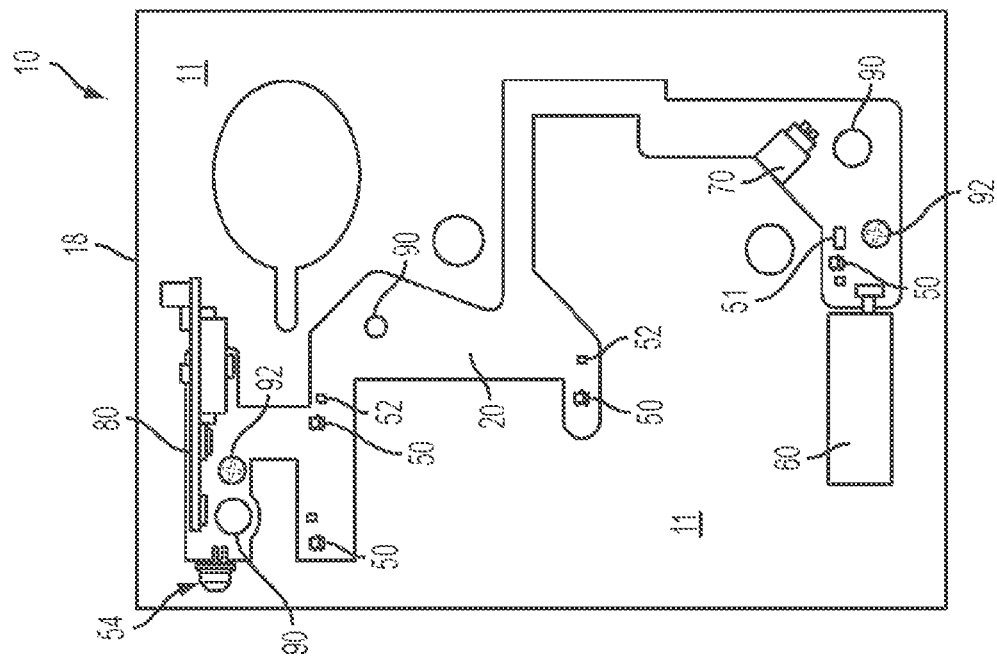
FIG. 1C is a top elevational view showing the PCB of FIG. 1B positioned over the recessed opening in the housing side of FIG. 1A.

In describing the embodiments of the present invention, reference will be made herein to FIGS. 1A-3C of the drawings in which like numerals refer to like features of the invention.

In one or more embodiments, the invention integrates electronic circuitry within existing and future locking devices. The locking devices suitable for use include those housed either entirely or partially within a housing, wherein one or more electronic circuit boards may be embedded in accordance with the various embodiments of the invention. These locking devices include, but are not limited to, a mortise lock, a bored lock, a cylindrical lock, an electric strike, a tubular lock, an auxiliary lock, and a deadbolt and the like.

Referring to FIGS. 1A-F, at least one interior surface 11, 13 of a locking device housing 10 is provided with a channel 12 that corresponds to the shape, size and thickness of a corresponding printed circuit board (PCB) 20. In one or more embodiments, this channel 12 is a recessed channel residing within a thickness of a housing side. The interior surfaces of the locking device housing 10 may include any interior surface within the housing 10 including, but not limited to, a first interior surface 11 of a first side 18 of the housing, a second interior surface 13 of a second side 19 of the housing, and so on. At least two or more of these interior surfaces of their respective sides may oppose one another, e.g., interior surface 11 of side 18 opposes interior surface 13 of side 19, with the mechanical working components of the lock residing therebetween.

Both the recessed channel 12 and the PCB 20 have corresponding shapes and sizes configured so that they avoid interference with mechanical working components of the locking device. Mechanical working components include latch bolts, dead bolts, cylinder locking mechanisms, blocking mechanisms, hubs, cams, levers, and the like. These shapes and sizes of the recessed channel 12 and PCB 20 also avoid interference with any openings in the housing 10 including, but not limited to, lock cylinder openings, screw or bolt openings, spindle openings, threaded openings, blocking openings, and the like.

The recessed channel 12 may be formed in one or more interior surfaces 11, 13 of the housing 10 sides 18, 19 using known techniques including, for example, stamping, routing, machining, cast molding, and the like. This recessed channel 12 may be formed in the sides 18, 19 to a depth "B" that is less than the total thickness "A" of its respective side 18, 19. The PCB 20 is formed to a thickness that is substantially equivalent to the depth "B" of the recessed channel, such that, upon positioning and embedding the PCB 20 into the recessed channel 12, a surface of the PCB 20 is substantially planar with the interior surface 11, 13 of the side 18, 19 in which the PCB resides, as is shown in FIGS. 1E-F.

In one or more embodiments, the first side 18 alone may be provided with an embedded PCB 20, the second side 19 alone may be provided with an embedded PCB 20, or alternatively, both the first and second sides 18, 19 of the locking device housing 10 each may be provided with one or more embedded PCBs 20 in accordance with the invention. That is, referring to FIGS. 1E and 2A-B, a plurality of recessed channels 12a, 12b, 12c may be formed in one or more sides of the housing, whereby correspondingly shaped and sized PCBs 20a, 20b, 20c are provided and embedded therein. These plurality of PCB's 20a, 20b, 20c may be electrically wired to one another either within the housing 10, or by providing openings 30a, 30b, 30C at a bottom of the corresponding recessed channels 12a, 12b, 12c, and through the use of conductive wiring 32, making the electrical wiring connections between the PCB's 20a, 20b, 20c through these openings 30a, 30b, 30C.

As an alternative to the multiple embedded PCBs 20a, 20b, 20c, or even in combination therewith, in one or more embodiments the PCB may be a single continuous circuit board embedded within an interior surface of one or more of the sides of the locking device housing 10, as shown in FIGS. 1A-F. Like that of the multiple embedded PCBs 20a, 20b, 20c, the single continuous PCB is configured with a shape and thickness that does not interfere with any working or moving components inside the mechanical lock. For instance, referring to the drawings, the PCB may have a shape that carries electrical wiring on the circuit board between the top 16 and bottom 17 of the lock and simultaneously between the left and right lateral sides 18, 19 of the lock. In one or more embodiments this shape may be a sinusoidal shape that covers over a distance of more than 50%, and even more than 60%, of the diagonal distance across the surface area of the side in which such sinusoidal shaped embedded PCB resides.

Referring again to the multiple embedded PCBs 20a, 20b, 20c, these PCBs also provide electrical wiring connections between the multiple circuit boards from top 16 to bottom 17 and left to right lateral sides 18, 19 of the lock. As such, the multiple PCBs may also cover over a distance of more than 50%, and even more than 60%, of the diagonal distance across the surface area of the housing side in which such multiple PCBs reside. It also should be appreciated that when two or more interior surfaces of the locking device housing 10 simultaneously each contain one or more embedded PCB(s), the circuit boards embedded within these multiple interior surfaces may be electrically connected to one another via wiring extending from one side of the housing 10 to the other side of the housing 10. This wiring may reside inside the locking device housing 10 (e.g., it may be contained within another circuit board), or it may reside outside the locking device housing and electrically connect the PCBs to one another through the openings 30 residing at the bottom of the recessed channels 12.

Referring to FIGS. 1E-F, the backside of each of the present PCB(s) 20 is substantially planar. In this manner, when the PCB 20 is positioned in the recessed channel 12, which also has an exposed substantially planar surface, a flat mating connection is made between the surfaces of the recessed channel and the backside of the PCB. Optionally, a barrier layer may be provided between the exposed surface of the recessed channel 12 and the backside of the PCB including, but not limited to, an insulator, a paste, an adhesive, and the like. Again, the exposed surface of the recessed channel 12 may optionally have one or more openings 30 traversing there-through. These openings 30 also allow electrical circuitry outside the lock to be connected via wiring to an electrical connector that may reside on the backside of the PCB in locations corresponding to the openings 30. A ground plate may also reside on the backside of the PCB along with the one or more electrical connector(s) or as a stand alone feature.

As shown in the drawings, the PCBs of the various embodiments of the invention each have a thickness substantially equivalent to the thickness or depth of the corresponding recessed channel into which such PCB is to be embedded. In this manner, once embedded therein, the exposed surface(s) of the PCB(s) and the exposed interior surface(s) of the housing side in which the recessed portion(s) reside are substantially planar with one another, as is shown in FIGS. 1E-F. By providing a planar surface with the interior housing side, the embedded PCB(s) minimize, or all together avoid, modifications to and/or rearrangements of existing mechanical working components of the locking device, avoid moving parts within the locking device, and optimize the positioning of sensors, magnets and/or actuators within the locking device as discussed further below.

Optionally, in locations that do not interfere with lock openings and/or working components multi-surface mount technology may be employed by mounting one or more additional circuit boards on top of the embedded PCB to provide the electrified lock with increased processing power. These additional surface mounted circuit boards extend upward from a surface of the embedded PCB into the locking device (may be parallel or perpendicular to the embedded PCB).

Either before or after the PCB is embedded inside the housing side, various electrical components may be surface mounted to the PCB in strategic locations across the board. In one or more embodiments, the working components of the mechanical lock may be provided with magnets 55 at various locations. These magnets 55 may reside on a surface of the working components, be inset into the surface of the working component, or even be imbedded inside the working component itself. The plurality of magnets 55 residing on the lock's working components provides the ability to monitor the working components at multiple locations to detect multiple positions, including opened and closed positions, of such working components, as opposed to conventional methods and approaches that only allow the monitoring and detection of opened and closed positions due to wire routing, size, and space constraints.

The PCB(s) of the invention may be provided with one or more sensors 50 at various locations across the PCB. A bypass capacitor 52 may be connected to each sensor 50 to eliminate system noise and avoid sensor oscillations. The sensors attached to the PCB include, but are not limited to, non-contact sensors, analogue transducers, hall sensors, electrical switches, reed switches, and the like. These sensors 50 are attached at positions corresponding to the magnets on the mechanical working components of the lock for sensing the positions of these various mechanical lock components. As the working component with its magnet moves or rotates, the magnet is brought into or out of close proximity with a sensor mounted on the PCB, thereby enabling monitoring of the door and/or lock movement to detect opening and closing of the door, tampering with and/or vandalism to the lock or door, actuation of levers or bolts, and the like.

In some embodiments, one or more sensor(s) 51 may be raised away from the surface of the PCB, such that, the raised sensor extends toward the other side of the housing for sensing magnets residing at or near this other side of the housing. As an alternative, an embedded PCB may reside in this other side of the housing and have one or more surface mounted sensors for detecting a magnet near this side, whereby the embedded PCBs on opposing sides may be connected to one another via electrical wiring.

Other electrical components that may be mounted to the PCBs of the invention include sensors 54 that do not require a magnet for triggering. These sensors may include, but are not limited to, mechanical micro-switches, a Magnasphere sensor, push buttons, optical sensors, and the like. An actuator 60 may also be attached to the housing side in which the embedded PCB resides to drive the lock components to lock and/or unlock the lock. The actuator 60 is attached to the housing side in a location that is in close proximity to the PCB so that the actuator 60 is electrically powered by the PCB via wiring and a connector. As an alternative, the actuator may be directly assembled to the PCB. Actuators 60 suitable for use in the various embodiments of the invention include, but are not limited to, solenoids, motors, brush DC motors, stepper motors, piezo motors, shape memory actuators, and the like. If increased electrical current is required, such as with the use of a solenoid actuator, traces may be routed through a middle PCB layer or the board may be conformally coated with an insulation layer to protect external circuits and components.

The PCBs may also be provided with one or more surface mount connectors 70 having inputs for electrical connection to the actuator 60. Other electrical components surface mounted onto the surface of the PCB that resides inside the lock include, but are not limited to, an accelerometer, temperature sensors, heating components, and the like. An accelerometer enables the measuring or impact on the door to detect if the door is being closed, if the door is being impacted or hit (e.g., someone vandalizing the door), and the like. Temperature sensors enable the measuring of the temperature inside the lock. A heating component provides heat inside the lock to control the internal lock temperature to prevent freezing and maintaining the workability of the internal mechanical lock components.

Figure 1D:
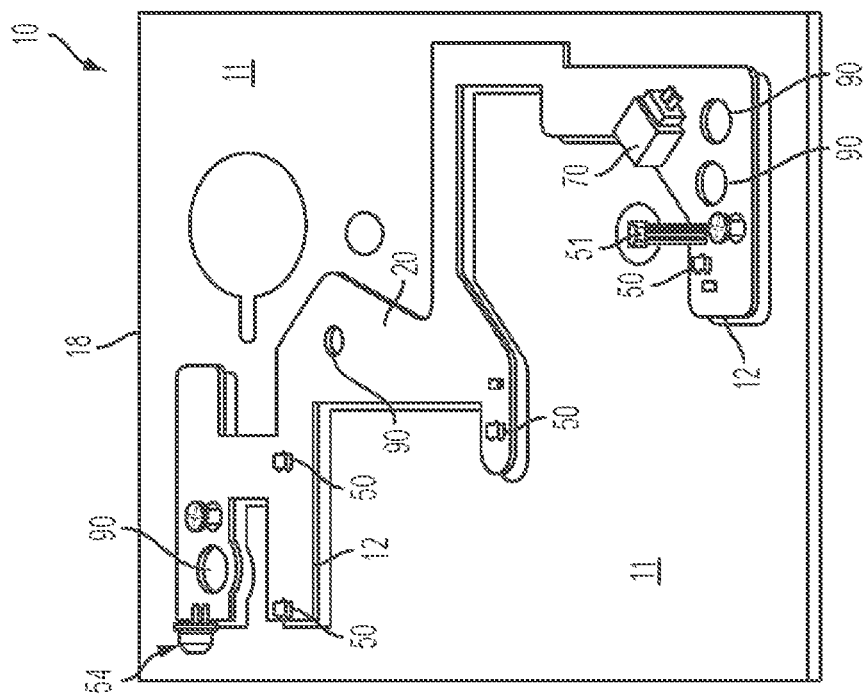
FIG. 1D is a top plane view showing the PCB of FIG. 1C embedded into the recessed opening in the housing side.

A signal output device 80 may be connected to the PCB. This signal output device 80 may be a controller board as shown in FIGS. 1B and 1D, or it may be a wire harness as shown in FIG. 2B. The signal output device 80 is an electronic module on the PCB that intakes the electrical signal outputs from the various electronic components residing on or in electrical communication with the PCB 20 and converts these inputs into a readable, digital output signal. For instance, a WIFI or communications module (e.g., Ethernet, bluetooth, and the like) may be assembled into the device 80 mounted on the PCB to link the PCB to a centralized lock control system. As such, this WIFI or communications module is embedded inside the lock.

At various locations across the present PCBs, selected ones or each of the PCBs may be provided with a number of openings 90 in the PCB. These openings 90 may reside in locations on the PCB corresponding to locations of working components of the lock, in locations corresponding to positions where external devices may be inserted into the lock, in locations corresponding to where screw 92 may be inserted to secure the housing side to the rest of the lock housing, and the like.

Figure 3A:
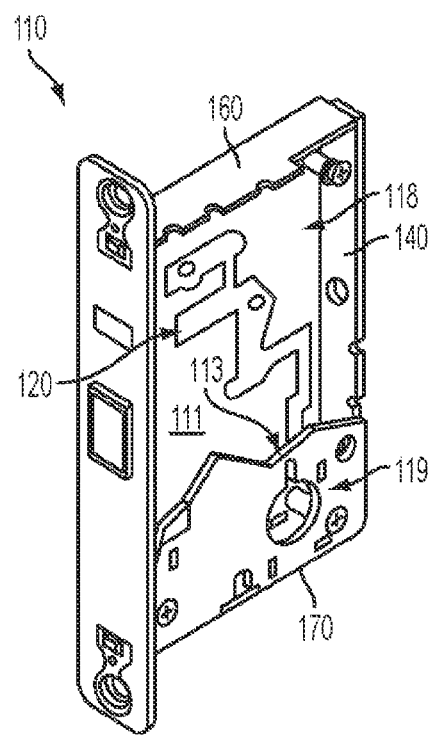
FIGS. 3A-C show side elevational views of one or more embodiments of the invention whereby one or more PCBs of the invention are embedded directly inside a mortise lock housing to convert a mechanical mortise lock into an electrified mortise lock having capabilities for digital monitoring and electronic actuation.
Figure 3B:
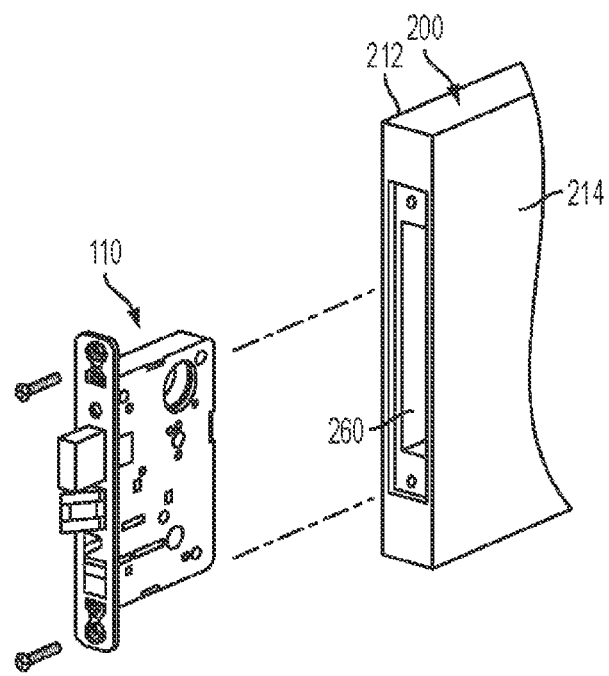
Figure 3C:
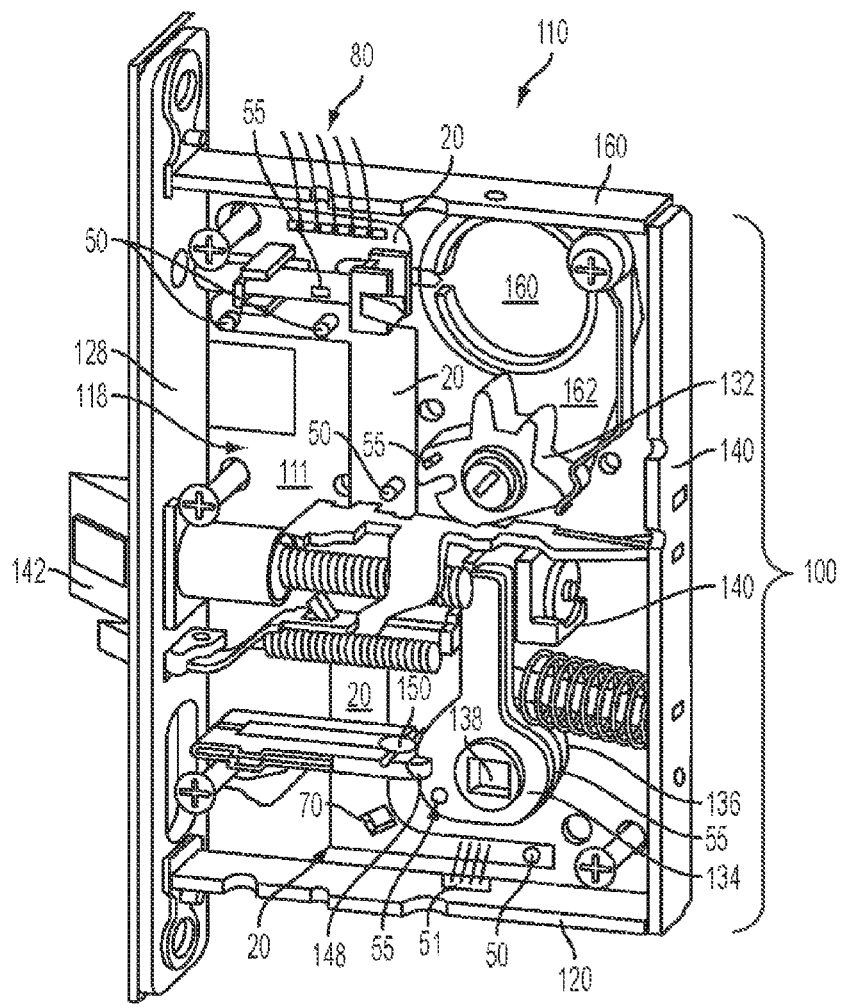

In accordance with the various embodiments of the invention, an access-control device 100 shown in FIG. 3C, for example, as a conventional mechanical locking device is converted into an electrified lock having electronic monitoring capabilities by providing one or more of the embedded PCBs of the invention therein. The present PCB configurations allow complex circuits to be integrated into an internal assembly, and in one or more embodiments into a single internal assembly, for easy and efficient conversion of an access-control device 100, for example, of ordinary existing mechanical lock with its internal working lock components into one that is an electrified lock. The invention has many advantages over the conventional methods and approaches of positioning switches and actuators and then routing and securing individual wires and/or wiring harnesses at numerous locations inside and outside the lock for connecting sensors at various locations across the lock and to an external harness or connector in order to electrify the lock. Some of these advantages include that the present invention provides an easy and efficient approach for electrification of an existing mechanical locking mechanism without significant mechanical redesign, challenging wire routing, and the limitations of switch or actuator positioning. The invention decreases costs, eases manufacturing, increases the performance capabilities that may be provided inside the existing mechanical lock, and provides a modular assembly that can be embedded inside the lock housing quickly and easily. Outsourcing of modular sub-assemblies also becomes possible to reduce cost.

Whether one or more PCBs are embedded inside a lock device housing, the invention enables the utilization of the embedded PCB(s) for all electronic functions within a locking mechanism to increase performance capabilities including, but not limited to, precise sensing, actuation, circuit routing, efficient electrical connectivity, signal conditioning (e.g., AC rectification), communications (e.g., WiFi, bluetooth, etc.), logic control, micro-processing which can condition the signals for input or output, signaling (e.g., LED, status indicators, etc.), and standardized connectorization to external circuits. The embedded PCBs of the invention may also be equipped with wireless or cellular circuits that may connect to an external antenna.

Again, the shape, size and length of each PCB of the invention, or combinations of PCBs, allow electrical wiring to be provided from one end of the lock to another end of the lock (e.g., from the bottom to the top of the lock). In one or more embodiments, the PCB(s) is provided over a diagonal distance across the lock from top to bottom, and vice versa, whereby multiple sensors are strategically positioned on the PCB to sense the magnets residing in or on the mechanical working components to detect the movement thereof. As such, the present PCBs provide all of the wiring within the lock housing and simultaneously provide the positioning for the various sensors within the lock that are used to detect motion of the mechanical lock components. This allows the circuitry to determine when the lock is open, when the dead bolt has been operated, when the dead bolt is in motion, and the like.

By embedding PCBs within an internal surface of a locking device housing 10, the various embodiments of the invention are suitable for use with those locking devices having constrained real estate. The invention converts a locking device having constrained real estate from a strictly mechanical locking device into an electrified lock having capabilities for digital monitoring and electronic actuation directly inside the locking device itself. These locking devices with constrained real estate may include existing locking devices having more compact designs, existing mechanical locking devices having increased and/or improved technological advances residing inside the locking device that consume an increased or substantial portion of the valuable real estate within the lock, and even future lock designs configured with constrained real estate.

While not meant to limit the invention, one or more embodiments of the invention are suitable for use with locking device housings 10 that encase the mechanical lock device components. For instance, one such suitable lock encasing is a mortise lock housing 110 as shown in FIGS. 3A-C. A mortise lock housing 110 includes a lateral side 119 being a cover plate and a casing portion. The casing portion of the mortise lock housing includes top 160 and bottom 170 walls, a back wall 140 and a lateral sidewall 118 that opposes the cover plate lateral side 119 when the housing is assembled. A front plate 128 resides opposite the back wall 140 and between sides 118, 119. Again, in one or more embodiments, an interior surface 111 of the first lateral sidewall 118 alone, an interior surface 113 of the cover plate 119 alone, or interior surfaces 111, 113 of both the sidewall 118 and the cover plate 119 of the mortise housing 110 may be provided with one or more embedded PCBs 120 in accordance with the invention.

Referring to FIG. 3C, a single embedded PCB 20 assembly of the invention is shown whereby the PCB is embedded in the lateral sidewall 118 of the housing casing behind the internal working components of the mortise lock. The exposed surface of the embedded PCB 20 is planar with an internal surface 111 of the lateral side 118 in which the embedded PCB resides, while the backside of the PCB 20 is in direct contact and flush with the inner surface of the recess/routed out depression in the side in which the PCB resides. The surface of PCB is provided with surface mount technology which allows the wiring and the components to be located entirely on the upper surface of the PCB that is exposed inside the lock. Again, the backside of the PCB optionally may include a ground plate and/or a connector that has a corresponding opening in the side 118, 119 allowing an electrical connector to be attached to the PCB from outside of the lock.

The embedded PCB 20 is configured with a shape, size and thickness that does not interfere with the positioning of the lock's working components residing inside the housing 110 and allows the PCB to pass around the various openings in the mortise lock. These working components residing inside the mortise lock include components connected to handle actuators to throw the dead bolt and the various pivots supported by the cover plate for components that move within the mortise lock. For instance, the working components may include, but are not limited to, a control hub 132, spindle hubs 134, 136, spindle openings 138, a latch bolt 142 having a latch bolt tail 140, a shaft 150 turned by a rotatable element 148, a latch retract lever 162, a lock cylinder opening 60 that may rotate the control hub 132 and the like.

In the various embodiments of the invention, one or more, or even all, of these working components of the mortise lock may be provided with one or more magnets 55 on or inserted into a surface thereof. With the PCB 20 configured to avoid the openings in the mortise lock and these working components, while still residing in close proximity thereto, the sensors 50 are strategically positioned on a surface of the PCB so that the sensors 50 are in close proximity to the various magnets 55 for detecting and monitoring motion of these working components of the lock.

Some of the sensors 50 may reside on the PCB while other sensors 51 may be connected with leads to allow the sensor 51 to stand up and away from the surface of the PCB. In this manner, the sensor 51 is projected into the lock mechanism toward the opposing sidewall to detect magnets 55 residing on locking components that reside adjacent or near this opposing sidewall. For instance, referring to FIG. 3C, the two spindle hubs 134, 136 each have a corresponding oval comprising a magnet 55. The spindle hub 136 closest to the PCB has a corresponding sensor 50 mounted directly on the surface of the PCB, while the spindle hub 134 located farthest from the PCB is sensed by a sensor 51 that is raised off the surface of the PCB and resides within the mechanical lock.

Once the interior surface of the lateral sidewall 118, the cover plate 119, or both the lateral sidewall 118 and the cover plate 119, have been provided with one or more embedded PCB(s) in accordance with the invention, the now electrified mortise lock is secured within a mortise recess 260 residing between front 214 and back 212 surfaces of a door 200. Accordingly, the various embodiments of the invention provide for the easy and efficient conversion of a conventional mortise lock into an electrified mortise lock having electronic capabilities, particularly, digital monitoring and electronic actuation inside the locking device itself. In one or more embodiments, the electrified mortise lock of the invention includes one or more PCBs configured to carry wiring from one portion of the mortise lock to another portion of the lock for the electrical connection of a variety of components residing on the PCB to provide the lock with hall effect and/or reed sensing, solenoid actuation for electrified locking and/or unlocking the mortise lock, minimal mechanical modifications, embedded magnets, on-board processing and/or communications linked to a centralized lock control system, and the like.

It should be appreciated that the housing side containing the embedded PCB may be configured as a universal lock housing side (e.g., a universal lock housing cover plate) for installation in existing lock devices having no electronic components. In this manner, a conventional non-electric lock having reduced cost, high volume, lock components may be converted into an electrified lock that has electrical monitoring and actuation capabilities.

It should be appreciated that in one or more embodiments of the invention the PCB(s) may be secured directly inside other types of housed locks including, for example, a cylindrical lock. In this aspect, an internal surface within the cylindrical lock (e.g., the cylindrical outside of the lock) may be provided with a recessed/routed out depression for accommodating an embedded PCB. Alternatively, an internal surface of the cylindrical lock may be provided with a mount for securing the PCB inside the lock. In either aspect, both the channel and the PCB are configured to avoid any openings and/or working components within the lock. The PCB is secured inside the channel so that the conventional cylindrical lock is converted from a non-electrified lock to an electrified cylindrical lock. For instance, the electrified cylindrical lock may include slotted mounts, reed sensing, an on-board bridge rectified solenoid circuit, a motor circuit, an integrated earth ground, a common wire harness connection and the like.

While not deviating from the novel concepts of the invention, the present embedded PCBs may be used in a variety of electronically actuated access-control devices 100 including, but not limited to, exit devices, electronic door strikes, door closers, door operators, cylindrical locks, tubular locks, auxiliary locks, deadbolts, and the like. For instance, one or more PCB may be embedded within the rail of an exit device, embedded within a plate of the door strike or closer, and the like. Additionally, the present embedded PCBs may be used in a variety of electronically actuated access-control devices 100 that employ the use of various access user recognition systems including, but not limited to, a key, a password, a card (e.g., the lock would include a slot for insertion of a card directly into a reader within the lock), magnetic components, a keypad, a fingerprint recognition device, an RF card reader, a remote controller recognition system, and the like.

While still not deviating from the novel concepts of the invention of having one or more PCBs residing inside a locking device itself, rather than embedding the board inside a side of the locking device housing, mounts or harnesses may be secured to an internal surface of the locking device housing. These mounts or harnesses may reside in locations that will not interfere either with the various lock openings or with the working components of the lock. The present PCBs may then be embedded within the mount(s) or harness(es) residing on an interior surface of the housing so that the PCBs reside inside the locking device housing itself. Optionally, one or more of the working components inside the lock may be mechanically machined to remove a portion of the working component thickness so as to prevent and/or avoid contact with the PCB mounted onto the internal surface of such housing side.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:
1. An electrified access-control device comprising:
a housing including at least one side having an internal surface facing an inside of said housing;
an access-control device residing in the inside of said housing;
a channel residing on said internal surface of said at least one side inside said housing; and
a printed circuit board (PCB) residing within said channel inside said housing, said PCB having various electrical components attached thereto for electrifying said access-control device, said variety of electrical components include one or more surface mount connectors attached to said PCB.

2. The electrified access-control device of claim 1 wherein said access-control device comprises a lock that is electrified by the PCB, the electrified lock being provided with both digital monitoring and electronic actuation capabilities.

3. The electrified access-control device of claim 2 wherein said electrified lock is selected from the group consisting of a mortise lock, a bored lock, an electric strike, a cylindrical lock, a tubular lock, an auxiliary lock, and a deadbolt.

4. The electrified access-control device of claim 1 wherein said access-control device is selected from the group consisting of an exit device, an electronic door strike, a door operator and a door closer.

5. The electrified access-control device of claim 1 wherein said channel is recessed within said internal surface of said at least one side inside said housing, said PCB having a configuration matching the recessed channel's configuration so that said PCB is matingly embedded within said recessed channel.

6. The electrified access-control device of claim 5 wherein an exposed surface of said embedded PCB is planar with a surface of said at least one side.

7. The electrified access-control device of claim 6 wherein said embedded PCB covers over a distance of more than 50% of a diagonal distance across a surface area of said internal surface of said at least one side of said housing.

8. The electrified access-control device of claim 1 further including:
a plurality of channels residing on said internal surface of said at least one side inside said housing;
a plurality of PCBs corresponding to configurations of each of said plurality of channels, whereby said plurality of PCBs are embedded within respective ones of said plurality of channels inside said housing; and
said various electrical components attached to said plurality of embedded PCBs for electrifying said access-control device.

9. The electrified access-control device of claim 1 wherein said various electrical components are selected from the group consisting of one or more sensors, actuators, surface mount connectors, signal output devices, accelerometers, temperature sensors, heating components, and combinations thereof.

10. An electrified access-control device for a door comprising:
a housing having a first side and a second side, each of said first and second sides having corresponding internal surfaces facing an inside of said housing;
an access-control device being a lock residing within the inside of said housing;
at least one recessed channel residing in said internal surface of either said first or second side of said housing;
at least one printed circuit board (PCB) embedded within said recessed channel in said internal surface of either said first or second side of said housing;
one or more openings in an exposed surface of said at least one recessed channel to access a backside of said at least one PCB; and
a variety of electrical components attached to said PCB to electrify said lock.

11. The electrified access-control device of claim 10 wherein said variety of electrical components provide said electrified lock with digital monitoring and electronic actuation capabilities.

12. The electrified access-control device of claim 10 wherein said electrified lock is selected from the group consisting of a mortise lock, a bored lock, a cylindrical lock, a tubular lock, an auxiliary lock, and a deadbolt.

13. The electrified access-control device of claim 10 wherein said at least one embedded PCB comprises a single PCB having a sinusoidal shape that covers over a distance of more than 50% of a diagonal distance across a surface area of said internal surface of said housing side in which said PCB is embedded.

14. The electrified access-control device of claim 10 wherein said at least one recessed channel and said at least one embedded PCB have matching configurations.

15. The electrified access-control device of claim 14 wherein said matching configurations of said at least one recessed channel and said at least one embedded PCB avoid interference with working components of said lock and openings in said housing.

16. The electrified access-control device of claim 10 wherein an exposed surface of said embedded PCB is planar with an exposed surface of said internal surface of said housing side in which said PCB is embedded.

17. The electrified access-control device of claim 10 wherein said variety of electrical components include one or more sensors residing on said PCB and positioned at various locations across said PCB, said various locations corresponding to locations where one or more magnets reside on mechanical working components of said lock, whereby said one or more sensors sense said one or more magnets to detect positions of said mechanical working components of said lock.

18. The electrified access-control device of claim 17 wherein said one or more sensors are selected from the group consisting of non-contact sensors, analogue transducers, hall sensors, electrical switches, reed switches, reed sensors, and combinations thereof.

19. The electrified access-control device of claim 17 wherein at least one of said one or more sensors is raised away from an exposed surface of said PCB to sense said one or more magnets residing adjacent an opposing side of said housing.

20. The electrified access-control device of claim 10 wherein said variety of electrical components include one or more sensors residing on said PCB that do not require a magnet for triggering.

21. The electrified access-control device of claim 10 wherein said variety of electrical components include an actuator residing inside said housing and in electrical communication with said PCB.

22. The electrified access-control device of claim 21 wherein said actuator is selected from the group consisting of a solenoid, motor, brush DC motor, stepper motor, piezo motor, and shape memory actuator.

23. An electrified access-control device for a door comprising:
a housing having a first side and a second side, each of said first and second sides having corresponding internal surfaces facing an inside of said housing;
an access-control device residing within the inside of said housing;
at least one recessed channel residing in said internal surface of either said first or second side of said housing;
at least one printed circuit board (PCB) embedded within said recessed channel in said internal surface of either said first or second side of said housing; and
a variety of electrical components attached to said PCB to electrify said access-control device, wherein said variety of electrical components include one or more surface mount connectors attached to said PCB.

24. The electrified access-control device of claim 10 wherein said variety of electrical components include one or more electrical components surface mounted to a surface of said PCB selected from the group consisting of one or more sensors, actuators, surface mount connectors, signal output devices, accelerometer, temperature sensors, heating components, and combinations thereof.

25. The electrified access-control device of claim 10 wherein said variety of electrical components include one or more signal output device connected to said PCB, said one or more signal output device converts various electrical outputs signals from said PCB into one or more digital output signals.

26. An electrified access-control device for a door comprising:
   a housing having a first side and a second side, each of said first and second sides having corresponding internal surfaces facing an inside of said housing;
   an access-control device residing within the inside of said housing;
   at least one recessed channel residing in said internal surface of either said first or second side of said housing;
   at least one printed circuit board (PCB) embedded within said recessed channel in said internal surface of either said first or second side of said housing; and
   a variety of electrical components attached to said PCB to electrify said access-control device, wherein said variety of electrical components include one or more signal output device selected from the group consisting of a controller board and a wire harness connected to said PCB, said one or more signal output device converts various electrical outputs signals from said PCB into one or more digital output signals.

27. An electrified access-control device for a door comprising:
   a housing having a first side and a second side, each of said first and second sides having corresponding internal surfaces facing an inside of said housing;
   an access-control device residing within the inside of said housing;
   a plurality of channels recessed within one or more of said first or second sides of said housing;
   a plurality of PCBs corresponding to configurations of said plurality of recessed channels, each of said plurality of PCBs being embedded within respective ones of said plurality of recessed channels; and
   a variety of electrical components attached to said plurality of embedded PCBs to electrify said access-control device,
   wherein said plurality of embedded PCBs reside on said first side alone, said second side alone, or both said first and second sides of said housing, whereby said plurality of embedded PCBs are in electrical communication with one another to electrify said access-control device.

28. An electrified access-control device comprising:
   a housing including at least one side having an internal surface facing an inside of said housing;
   an access-control device residing in the inside of said housing;
   a channel residing on said internal surface of said at least one side inside said housing;
   a printed circuit board (PCB) residing within said channel inside said housing, said PCB having various electrical components attached thereto for electrifying said access-control device; and
   one or more openings in an exposed surface of said housing to access a backside of said PCB.

29. An electrified access-control device for a door comprising:
   a housing having a first side and a second side, each of said first and second sides having corresponding internal surfaces facing an inside of said housing;
   an access-control device residing within the inside of said housing;
   at least one channel residing in said internal surface of either said first or second side of said housing;
   at least one printed circuit board (PCB) residing within said channel; and
   a variety of electrical components attached to said PCB to electrify said access-control device, said variety of electrical components include one or more signal output device selected from the group consisting of a controller board and a wire harness connected to said PCB, said one or more signal output device converts various electrical outputs signals from said PCB into one or more digital output signals.

30. An electrified access-control device for a door comprising:
   a housing having a first side and a second side, each of said first and second sides having corresponding internal surfaces facing an inside of said housing;
   an access-control device residing within the inside of said housing;
   a plurality of channels within one or more of said first or second sides of said housing;
   a plurality of PCBs corresponding to configurations of said plurality of channels, each of said plurality of PCBs residing within respective ones of said plurality of channels; and
   a variety of electrical components attached to said plurality of PCBs to electrify said access-control device,
   wherein said plurality of PCBs reside on said first side alone, said second side alone, or both said first and second sides of said housing, said plurality of embedded PCBs are in electrical communication with one another to electrify said access-control device.

* * * * *